(12) United States Patent
Kim et al.

(10) Patent No.: US 12,231,100 B2
(45) Date of Patent: Feb. 18, 2025

(54) APPARATUS AND METHOD FOR RECEIVING STROBE SIGNAL

(71) Applicant: ELECTRONICS AND TELECOMMUNICATIONS RESEARCH INSTITUTE, Daejeon (KR)

(72) Inventors: Yi-Gyeong Kim, Daejeon (KR); Young-Deuk Jeon, Daejeon (KR); Young-Su Kwon, Daejeon (KR); Jin-Ho Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 185 days.

(21) Appl. No.: 17/903,112

(22) Filed: Sep. 6, 2022

(65) Prior Publication Data

US 2023/0115549 A1 Apr. 13, 2023

(30) Foreign Application Priority Data

Oct. 7, 2021 (KR) .................. 10-2021-0133091
Jun. 24, 2022 (KR) .................. 10-2022-0077341

(51) Int. Cl.
G11C 7/22 (2006.01)
G11C 8/18 (2006.01)
(Continued)

(52) U.S. Cl.
CPC .......... H03F 3/45179 (2013.01); G11C 7/22 (2013.01); G11C 7/222 (2013.01); G11C 8/18 (2013.01);
(Continued)

(58) Field of Classification Search
CPC ............ H03F 3/45179; H03F 3/45201; H03F 2200/375; G11C 7/222; G11C 8/18;
(Continued)

(56) References Cited

U.S. PATENT DOCUMENTS 7,859,299 B1* 12/2010 Gay .................. G11C 7/1066
326/62
8,233,332 B2* 7/2012 Nguyen ................. G11C 7/22
365/230.06
(Continued)

FOREIGN PATENT DOCUMENTS

KR 10-2013-0028013 A 3/2013

OTHER PUBLICATIONS

Mino Kim et al., "A 4266Mb/s/pin LPDDR4 Interface with an Asynchronous Feedback CTLE and an Adaptive 3-step Eye Detection Algorithm for Memory Controller," IEEE Transactions on Circuits and Systems II: Express Briefs, 2018.

*Primary Examiner* — Huan Hoang
*Assistant Examiner* — Justin Bryce Heisterkamp

(57) ABSTRACT

An apparatus for receiving a strobe signal may include an amplifier for amplifying a strobe signal input thereto, an offset generator for controlling the setting of a threshold for detecting a preamble signal by generating an offset for the amplifier, and a preamble detector for detecting a first preamble signal occurring at a point at which the amplified strobe signal is equal to or greater than the threshold and turning off the offset generator when the first preamble signal is detected.

20 Claims, 12 Drawing Sheets

(51) Int. Cl.
*H03F 3/45* (2006.01)
*G11C 7/10* (2006.01)

(52) U.S. Cl.
CPC ........ *H03F 3/45201* (2013.01); *G11C 7/1078* (2013.01); *G11C 7/225* (2013.01); *H03F 2200/375* (2013.01)

(58) Field of Classification Search
CPC ..... G11C 7/1078; G11C 7/225; G11C 7/1057; G11C 7/1066
See application file for complete search history.

(56) References Cited

U.S. PATENT DOCUMENTS

| | | | |
|---|---|---|---|
| 8,897,084 B2 | 11/2014 | Chen | |
| 9,819,456 B1 | 11/2017 | Bellorado | |
| 2007/0217559 A1* | 9/2007 | Stott | H04L 7/0008 |
| | | | 375/355 |
| 2012/0147763 A1 | 6/2012 | Lee | |
| 2013/0148447 A1* | 6/2013 | Shaeffer | G11C 5/04 |
| | | | 365/189.17 |
| 2013/0290766 A1* | 10/2013 | Nguyen | G06F 1/12 |
| | | | 713/400 |
| 2013/0315342 A1 | 11/2013 | Um | |
| 2014/0307514 A1* | 10/2014 | Prakash | G11C 7/222 |
| | | | 365/193 |

\* cited by examiner

APPARATUS AND METHOD FOR RECEIVING STROBE SIGNAL

CROSS REFERENCE TO RELATED APPLICATIONS

This application claims the benefit of Korean Patent Application No. 10-2021-0133091, filed Oct. 7, 2021, and No. 10-2022-0077341, filed Jun. 24, 2022, which are hereby incorporated by reference in their entireties into this application.

BACKGROUND OF THE INVENTION

1. Technical Field

The present disclosure relates generally to an apparatus and method for receiving a strobe signal, which have improved preamble pulse detection performance.

2. Description of the Related Art

Generally, a memory interface receives a differential signal to be used for the internal operation thereof and processes the same. In order to guarantee the quality of a high-speed memory operation, a differential data strobe (DQS) signal, which is a kind of differential signal, may be used for reception of data, and signals forming a differential DQS signal may generally have a phase difference of 180 degrees.

In the case of low-power memory and High-Bandwidth Memory (HBM) for improving power efficiency, a memory interface transmits a strobe signal only when it transmits data, whereby power loss arising from unnecessary clock transmission may be reduced.

However, as a data transfer rate increases, time is required to stabilize a strobe due to the signal loss at a high frequency in an interconnect channel. In order to stabilize a strobe, a memory interface uses a preamble pulse before data transmission.

Accordingly, the receiver unit of the memory interface captures data when a strobe is stabilized after the preamble.

However, when a strobe is slowly settled down due to the channel characteristics of a signal band, the initial pulse of a preamble may not be restored, and the pulse that is not restored delays the timing of a data capture strobe, whereby a data transmission error may occur.

SUMMARY OF THE INVENTION

An object of the present disclosure is to provide an apparatus and method for receiving a strobe signal in order to improve the reliability of restoration of the initial pulse of a preamble and the stability of high-speed data transmission.

In order to accomplish the above object, an apparatus for receiving a strobe signal according to the present disclosure may include an amplifier for amplifying a strobe signal input thereto, an offset generator for controlling the setting of a threshold for detecting a preamble signal by generating an offset for the amplifier, and a preamble detector for detecting a first preamble signal occurring at a point at which the amplified strobe signal is equal to or greater than the threshold and for turning off the offset generator when the first preamble signal is detected.

The offset generator may generate the offset before the strobe signal is input to the amplifier.

The offset generator may control the setting of the threshold so as to decrease the initial set value of the threshold.

The offset generator may include multiple transistor switches, and an on/off operation of the offset generator may be performed by on/off operations of the multiple transistor switches.

The offset generator may include current sources respectively connected to the multiple transistor switches, and the threshold may be precisely controlled using the current sources.

The amplifier may include multiple differential-input transistors, and the offset generator may be connected in parallel to the multiple differential-input transistors.

The preamble detector may include a counter for counting a pulse of the strobe signal and preamble detector logic for providing an on/off signal to the offset generator based on the result of counting.

The preamble detector may include a D flipflop, and may provide an off signal to the offset generator by detecting a first falling edge of the strobe signal using the D flipflop.

The apparatus may further include a buffer capable of driving a large load by receiving the amplified strobe signal. The preamble detector may be connected to the output terminal of the amplifier or the output terminal of the buffer.

Also, a method for receiving a strobe signal according to an embodiment may include amplifying, by an amplifier, a strobe signal input to the amplifier; generating, by an offset generator, an offset for the amplifier, thereby controlling the setting of a threshold for detecting a preamble signal; and detecting, by a preamble detector, a first preamble signal occurring at a point at which the amplified strobe signal is equal to or greater than the threshold and turning off the offset generator when the first preamble signal is detected.

The offset may be generated before the strobe signal is input to the amplifier.

The offset generator may control the setting of the threshold so as to decrease the initial set value of the threshold.

The offset generator may include multiple transistor switches, and an on/off operation of the offset generator may be performed by on/off operations of the multiple transistor switches.

The offset generator may include current sources respectively connected to the multiple transistor switches, and the threshold may be precisely controlled using the current sources.

The amplifier may include multiple differential-input transistors, and the offset generator may be connected in parallel to the multiple differential-input transistors.

The preamble detector may include a counter for counting a pulse of the strobe signal and preamble detector logic for providing an on/off signal to the offset generator based on the result of counting.

The preamble detector may include a D flipflop, and may provide an off signal to the offset generator by detecting a first falling edge of the strobe signal using the D flipflop.

A buffer capable of driving a large load by receiving the amplified strobe signal may be further included.

The preamble detector may be connected to the output terminal of the amplifier or the output terminal of the buffer.

BRIEF DESCRIPTION OF THE DRAWINGS

The above and other objects, features, and advantages of the present disclosure will be more clearly understood from the following detailed description taken in conjunction with the accompanying drawings, in which.

DESCRIPTION OF THE PREFERRED EMBODIMENTS

Figure 1:
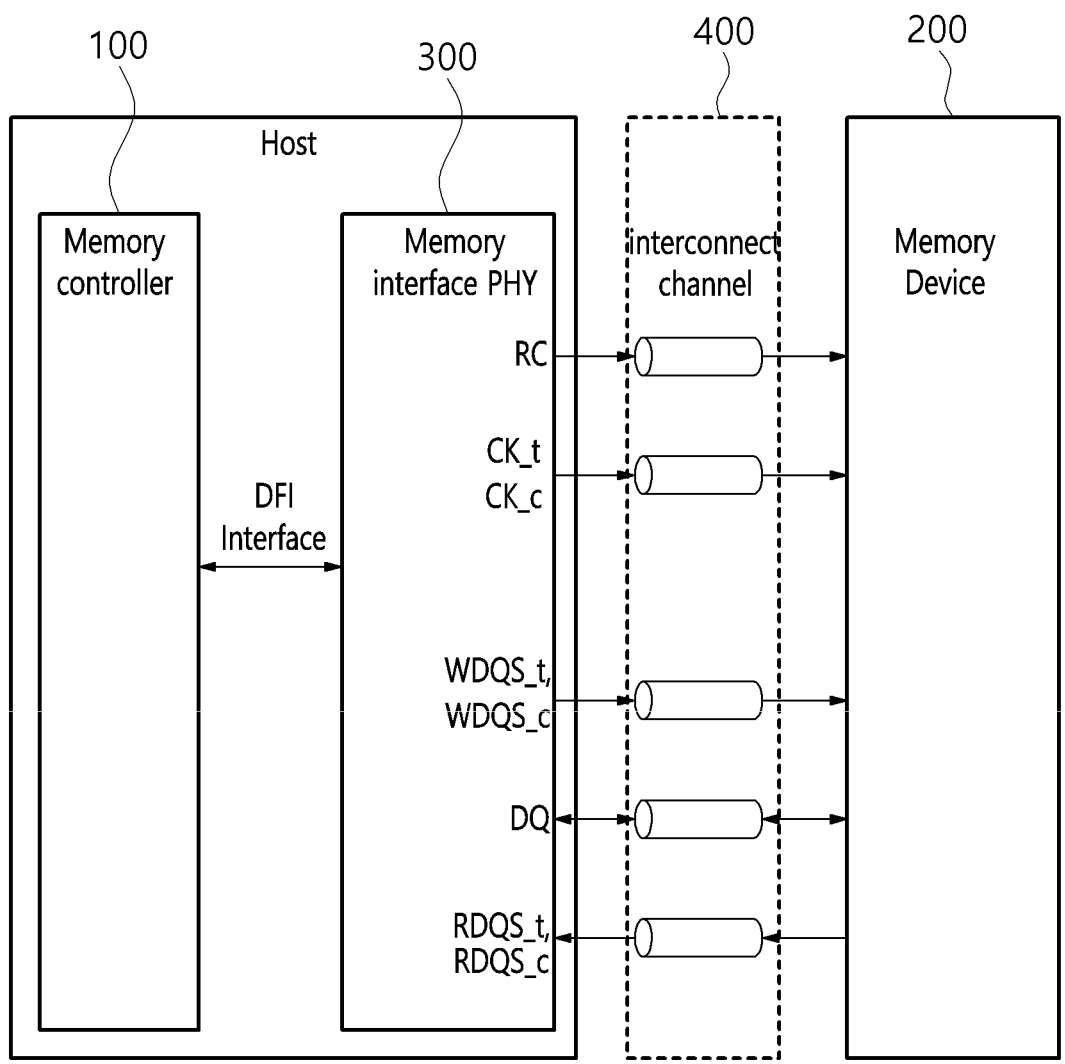
FIG. 1 is a block diagram illustrating the structure of a memory system according to an embodiment of the present disclosure.

The advantages and features of the present disclosure and methods of achieving the same will be apparent from the exemplary embodiments to be described below in more detail with reference to the accompanying drawings. However, it should be noted that the present disclosure is not limited to the following exemplary embodiments, and may be implemented in various forms. Accordingly, the exemplary embodiments are provided only to disclose the present disclosure and to let those skilled in the art know the category of the present disclosure, and the present disclosure is to be defined based only on the claims. The same reference numerals or the same reference designators denote the same elements throughout the specification.

It will be understood that, although the terms "first," "second," etc. may be used herein to describe various elements, these elements are not intended to be limited by these terms. These terms are only used to distinguish one element from another element. For example, a first element discussed below could be referred to as a second element without departing from the technical spirit of the present disclosure.

The terms used herein are for the purpose of describing particular embodiments only, and are not intended to limit the present disclosure. As used herein, the singular forms are intended to include the plural forms as well, unless the context clearly indicates otherwise. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

Unless differently defined, all terms used herein, including technical or scientific terms, have the same meanings as terms generally understood by those skilled in the art to which the present disclosure pertains. Terms identical to those defined in generally used dictionaries should be interpreted as having meanings identical to contextual meanings of the related art, and are not to be interpreted as having ideal or excessively formal meanings unless they are definitively defined in the present specification.

In the present specification, each of expressions such as "A or B", "at least one of A and B", "at least one of A or B", "at least one of A, B, and C", and "at least one of A, B, or C" may include any one of the items listed in the expression or all possible combinations thereof.

Hereinafter, embodiments of the present disclosure will be described in detail with reference to the accompanying drawings. In the following description of the present disclosure, the same reference numerals are used to designate the same or similar elements throughout the drawings, and repeated descriptions of the same components will be omitted.

FIG. 1 is a block diagram illustrating the structure of a memory system according to the present disclosure.

Referring to FIG. 1, a memory system according to an embodiment may include a memory controller 100 and a memory device 200.

The memory controller 100 may control memory operations, such as write, read, and other operations, by providing various kinds of signals to the memory device 200 via an interconnect channel 400 through a memory interface 300, and may transmit and receive data to and from the memory device 200.

Describing transmission and reception between a host and a memory device, data is transmitted along with a strobe signal from a transmission side, and the data may be captured according to the strobe signal on a reception side.

For example, when a write operation is performed, a command and an address (RC) may be transmitted to the memory device according to a clock CK (Ck_t, CK_c), and after a preset time period, data may be transmitted along with a WDQS strobe signal from the host to the memory device 200.

When a read operation is performed, RC is transmitted to the memory device 200 according to a clock CK, and after a preset time period, data is transmitted along with a RDQS strobe signal from the memory device 200 to the host.

In order to improve data transmission efficiency, which is evaluated for each strobe signal pulse, data may be transmitted at a double data rate (DDR) such that the data can be captured at the two edges of a data strobe, namely at the rising edge and the falling edge, when a write or read operation is performed.

Figure 2:
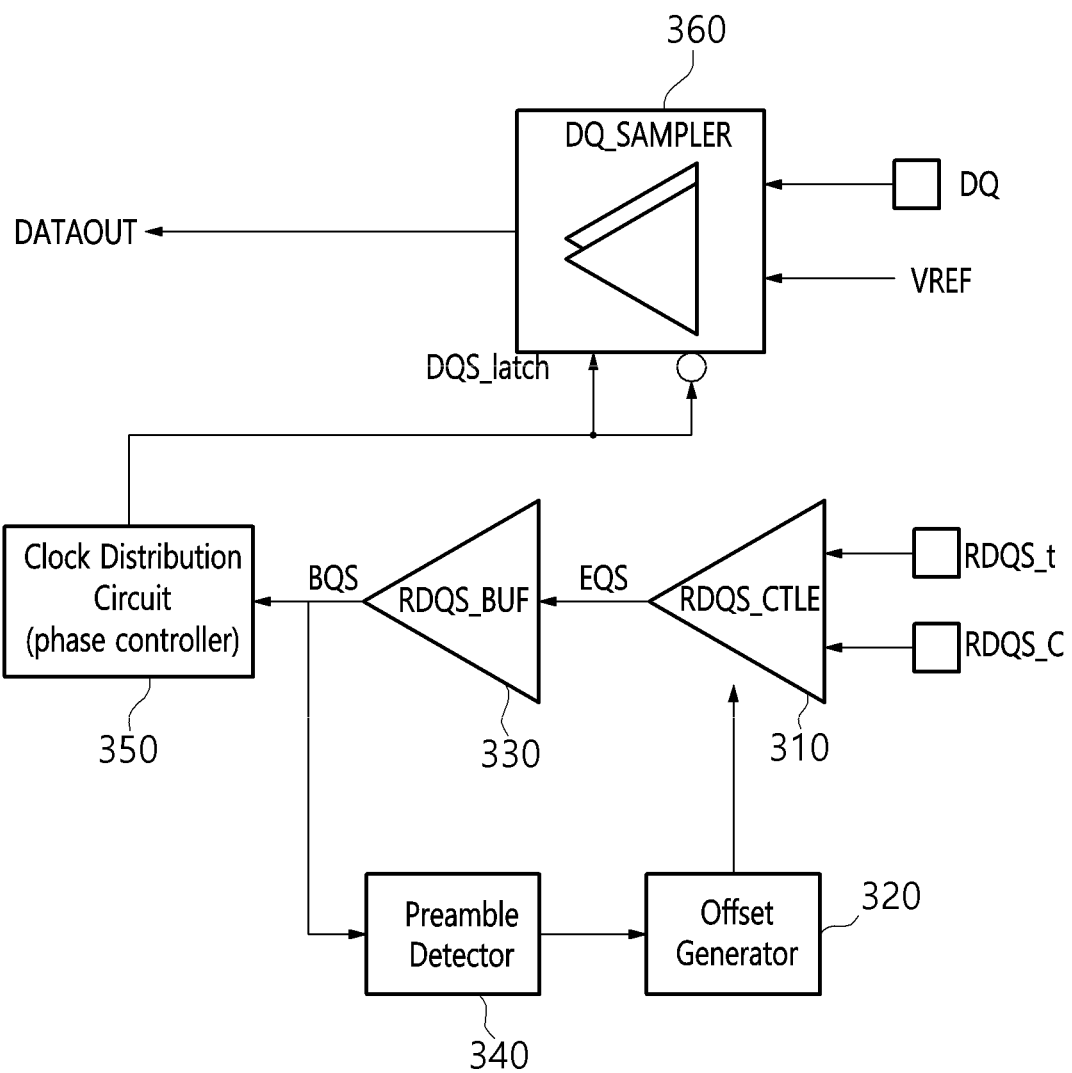
FIG. 2 is a block diagram illustrating an apparatus for receiving a strobe signal according to a first embodiment of the present disclosure.

FIG. 2 is a block diagram illustrating an apparatus for receiving a strobe signal according to a first embodiment of the present disclosure.

As illustrated in FIG. 2, a memory interface 300 may include an apparatus for receiving a strobe signal. The apparatus for receiving a strobe signal may prevent a pulse error of a strobe signal from occurring when the signal bandwidth of an interconnect channel is low.

The apparatus for receiving a strobe signal may include an amplifier 310, a buffer 330, a clock distribution circuit 350, a data sampler 360, an offset generator 320, and a preamble detector 340.

The amplifier 310 may amplify a strobe signal. A strobe signal input to the amplifier 310 may include a first strobe signal RDQS_t and a second strobe signal RDQS_c. The strobe signal RDQS_diff may be a difference signal between the first strobe signal and the second strobe signal.

In addition, the amplifier 310 may equalize the first strobe signal RDQS_t and the second strobe signal RDQS_c. The amplifier 310 may include a separate equalizing module for equalizing the first strobe signal and the second strobe signal.

The buffer 330 may be provided with a strobe signal, convert the same into a digital signal, and output the digital signal. The buffer 330 may drive a large load by receiving a strobe signal. The clock distribution circuit 350 may receive the output of the buffer 330, calibrate a phase difference between the received output and data DQ, and supply a strobe latch signal DQS_latch to the data sampler 360. The data sampler 360 may capture the data DQ according to the strobe latch signal and output the same.

Meanwhile, the apparatus for receiving a strobe signal may detect a preamble signal occurring at a point at which the strobe signal is equal to or greater than a preset threshold.

In the process of detecting a preamble signal, the apparatus for receiving a strobe signal may fail to detect an initial preamble signal when the signal bandwidth of an interconnect channel is low.

In order to prevent this, the apparatus for receiving a strobe signal may include an offset generator 320.

The offset generator 320 may control the setting of a preset threshold. The offset generator 320 may provide an offset to the amplifier 310 in order to decrease the set value of the initial threshold. The offset generator 320 may control the setting of the threshold before a strobe signal is input to the amplifier 310.

The preamble detector 340 may detect a preamble signal occurring at a point at which a strobe signal is equal to or greater than the threshold. The preamble detector 340 may be connected to the output terminal of the buffer 330, but the present disclosure is not limited to this configuration.

The preamble detector 340 may turn off the offset generator 320 when a first preamble signal is detected. When the offset generator 320 is turned off, the threshold may be set back to the initial set value.

Figure 3:
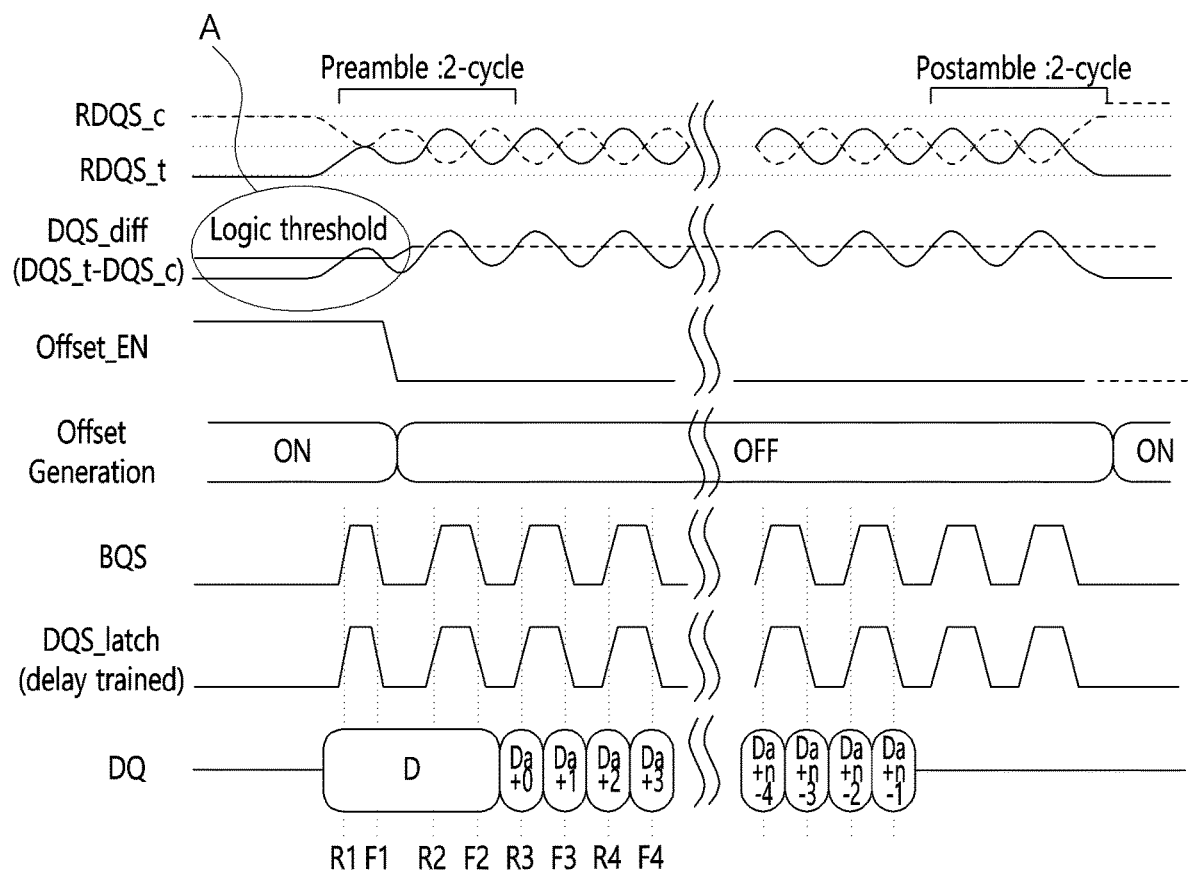
FIG. 3 is a graph illustrating waveforms of signals in the apparatus for receiving a strobe signal according to the first embodiment of the present disclosure.

FIG. 3 is a graph illustrating waveforms of signals in an apparatus for receiving a strobe signal according to a first embodiment of the present disclosure.

As illustrated in FIG. 3, an offset is generated in the initial section A before a strobe signal is input to an amplifier, whereby setting is made to decrease a preset threshold. Here, the strobe signal may have an unsettled waveform due to the low signal bandwidth of an interconnect channel.

In an embodiment, control is performed to decrease a preset initial threshold, whereby the unsettled waveform of the signal becomes equal to or greater than the threshold. The preamble detector 340 detects a preamble signal corresponding to the strobe signal equal to or greater than the threshold, and turns off the offset generator 320. Accordingly, the amplifier 310 may operate without an offset from the second preamble pulse.

In the embodiment, because a missing strobe pulse less than the threshold is not present, the data sampler 360 captures data from edge R3, thereby capturing valid data without errors.

Figure 4:
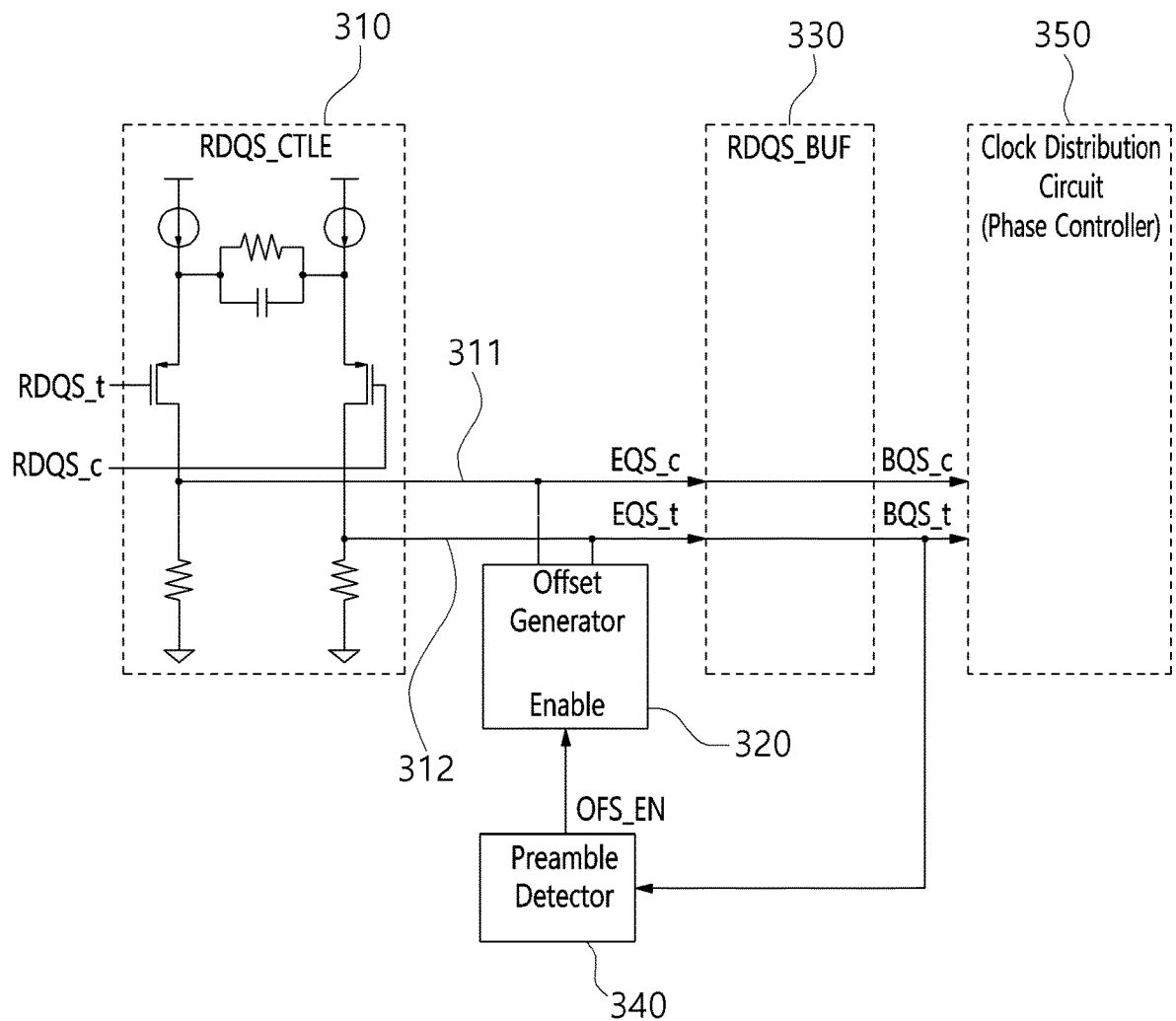
FIG. 4 is a circuit diagram illustrating a point to which an offset generator is connected.

FIG. 4 is a circuit diagram illustrating a point to which an offset generator is connected.

As illustrated in FIG. 4, the offset generator 320 may be connected to the output terminals 311 and 312 of an amplifier 310. The offset generator 320 may be connected to the respective output terminals of two transistor switches, and on/off operation thereof may be performed depending on the on/off operation of the transistor switches. The offset generator 320 may be designed as a circuit capable of generating an input-equivalent offset of the amplifier 310.

Figure 5:
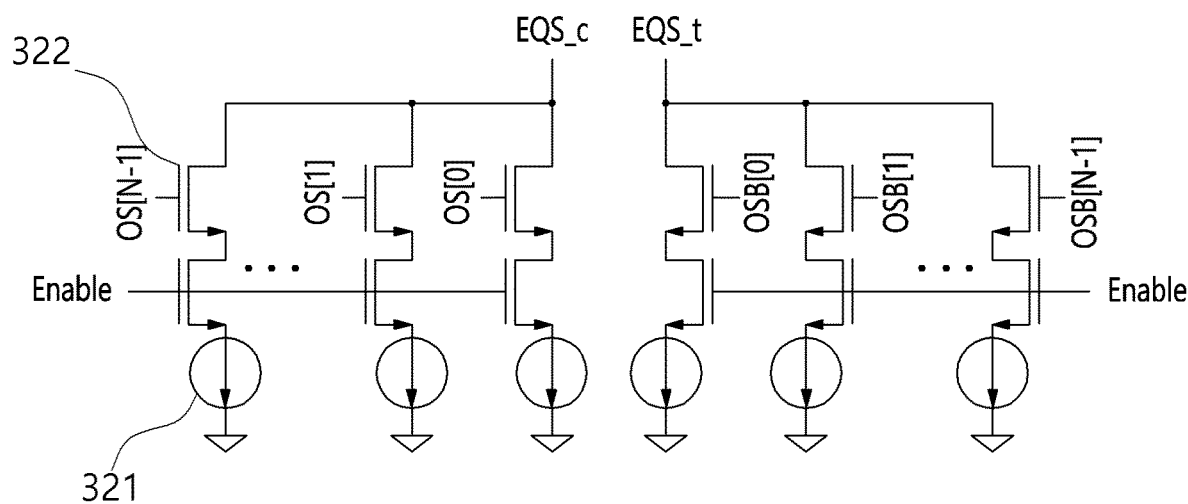
FIG. 5 and FIG. 6 are circuit diagrams illustrating various structures of an offset generator.
Figure 6:
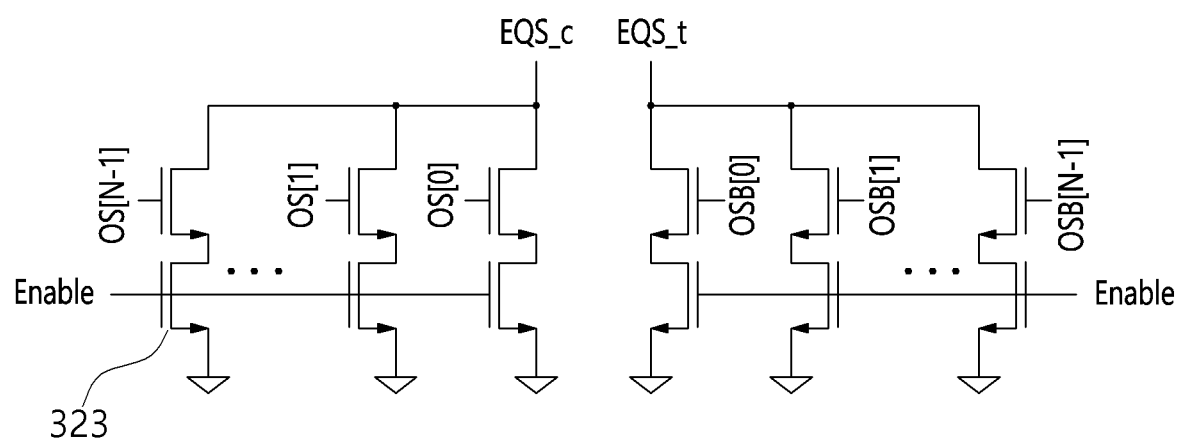

FIG. 5 and FIG. 6 are circuit diagrams illustrating various structures of an offset generator.

As illustrated in FIG. 5, the offset generator 320 according to an embodiment may include multiple transistor switches 322. The offset generator may include a plurality of first transistor switches connected to the output line of a first strobe signal and a plurality of second transistor switches connected to the output line of a second strobe signal.

Multiple current sources 321 are respectively connected to the multiple transistor switches 322. The current sources 321 may serve to precisely control an offset voltage.

As illustrated in FIG. 6, the offset generator 320 according to an embodiment may include multiple transistor switches 323. The offset generator 320 may include a plurality of first transistor switches OSB[0] to OSB[N−1] connected to the output line of a first strobe signal EQS_t and a plurality of second transistor switches OS[0] to OS[N−1] connected to the output line of a second strobe signal EQS_c.

Unlike the offset generator in FIG. 5, the offset generator 320 according to an embodiment may be formed only of multiple transistor switches without current sources. Accordingly, on/off operation of the offset generator may be performed by turning on/off the multiple transistor switches.

Figure 7:
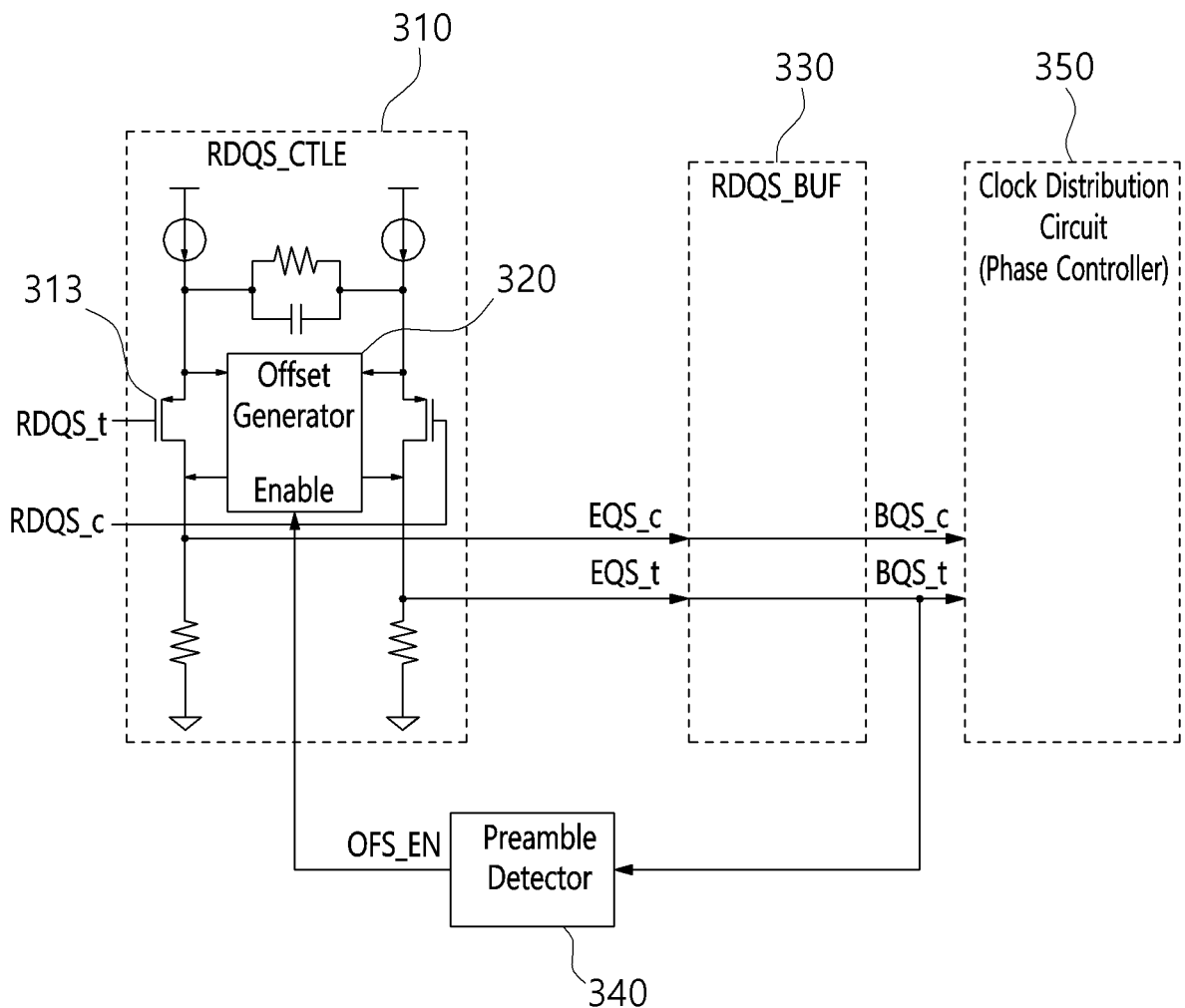
FIG. 7 and FIG. 8 are circuit diagrams illustrating various points to which an offset generator is connected.
Figure 8:
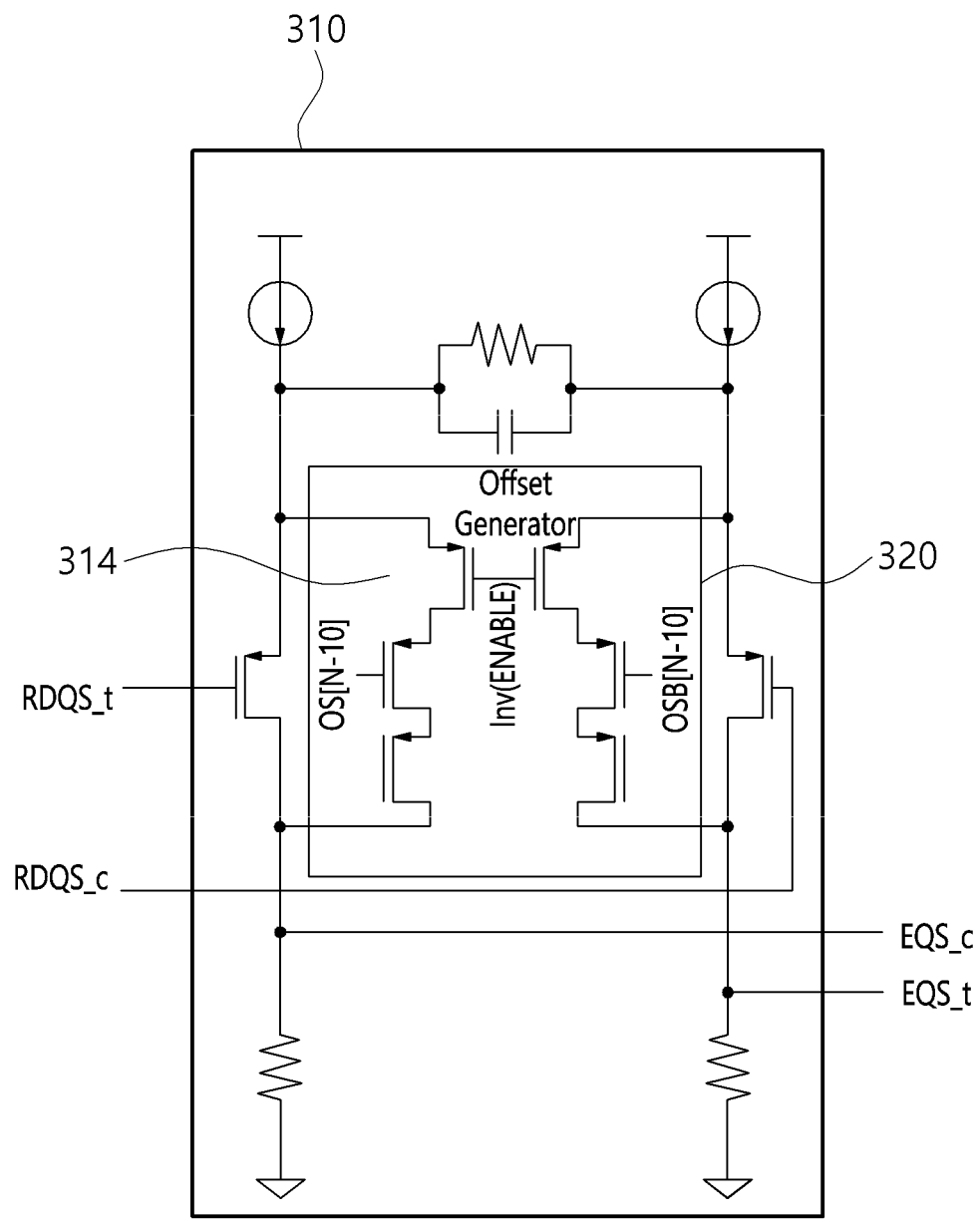

FIG. 7 and FIG. 8 are circuit diagrams illustrating various points to which an offset generator is connected.

As illustrated in FIG. 7, the offset generator 320 according to an embodiment may be connected to an amplifier 310. The amplifier 310 may include a current source, a resistor, a capacitor, and multiple differential-input transistors 313 to which a strobe signal is applied. The offset generator 320 may be connected in parallel to the multiple differential-input transistors 313.

As illustrated in FIG. 8, the offset generator 320 according to an embodiment may be connected to an amplifier 310. The amplifier 310 may include a current source, a resistor, a capacitor, and multiple differential-input transistors to which a strobe signal is applied. The offset generator 320 may be formed of multiple on-off switches 314 to which signals OS[N−10] and OSB[N−10] are applied.

Figure 9:
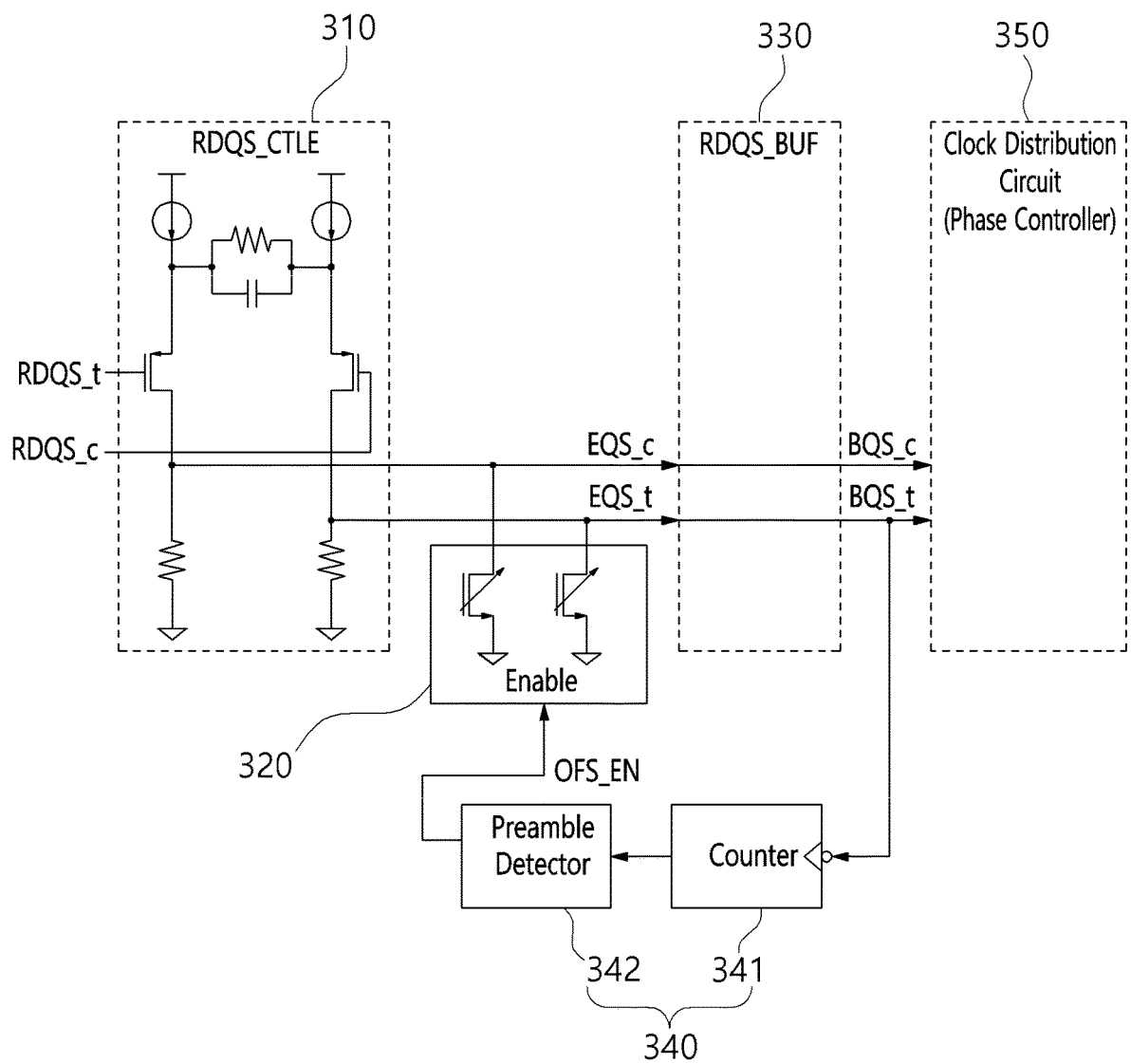
FIG. 9 and FIG. 10 are circuit diagrams illustrating various structures of a preamble detector.
Figure 10:
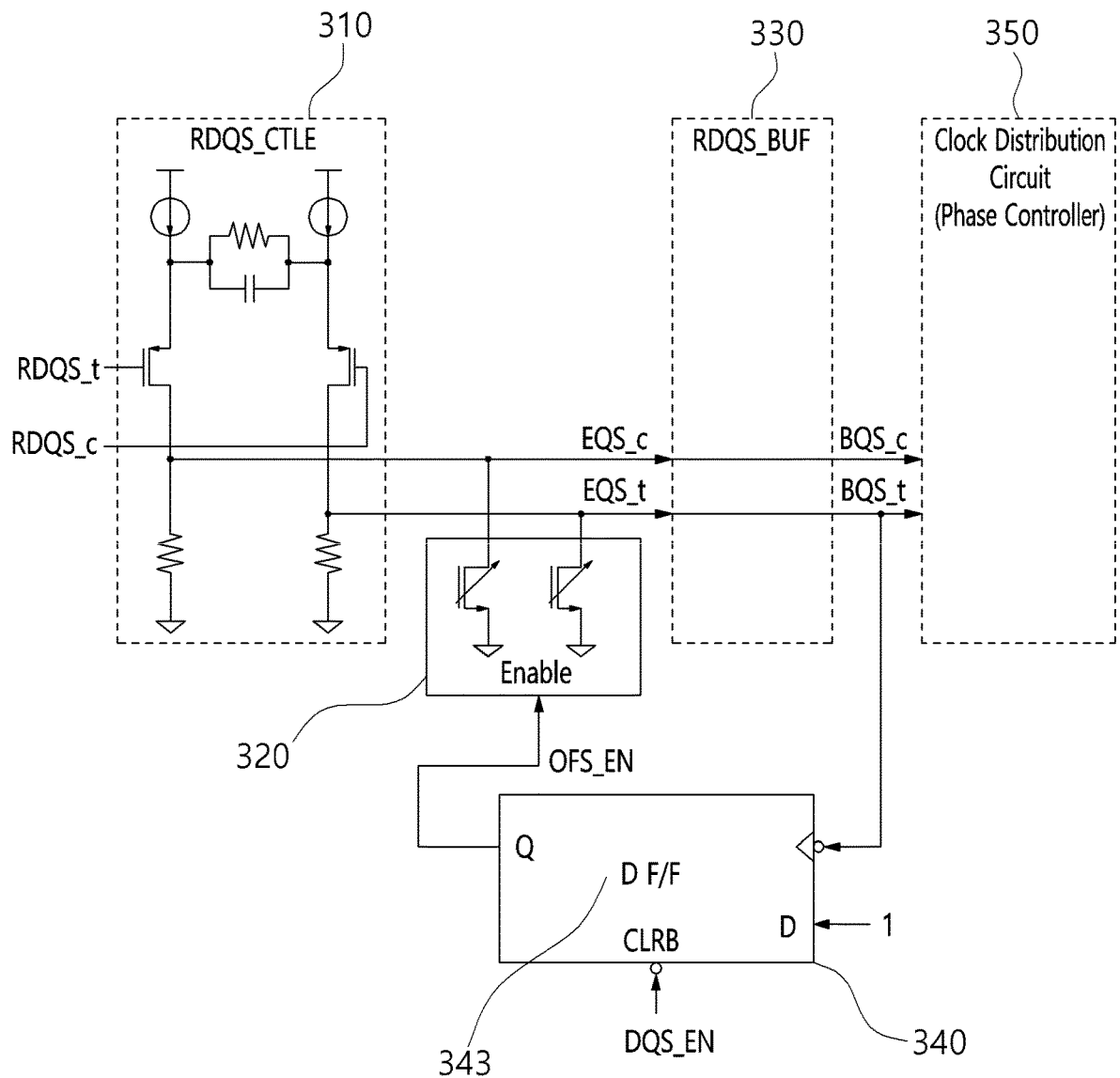

FIG. 9 and FIG. 10 are circuit diagrams illustrating various structures of a preamble detector.

As illustrated in FIG. 9, the preamble detector 340 according to an embodiment may include a counter 341 and preamble detector logic 342.

The counter 341 may count the pulse of a strobe signal. The preamble detector logic 342 may provide an on/off signal to the offset generator 320, which is formed of multiple transistor switches, based on the result of counting the strobe signal pulse.

As illustrated in FIG. 10, the preamble detector 340 according to an embodiment may include a D flipflop 343. The preamble detector 340 detects the first falling edge of a strobe signal using the D flipflop 343, and may provide an off signal to the offset generator 320.

Figure 11:
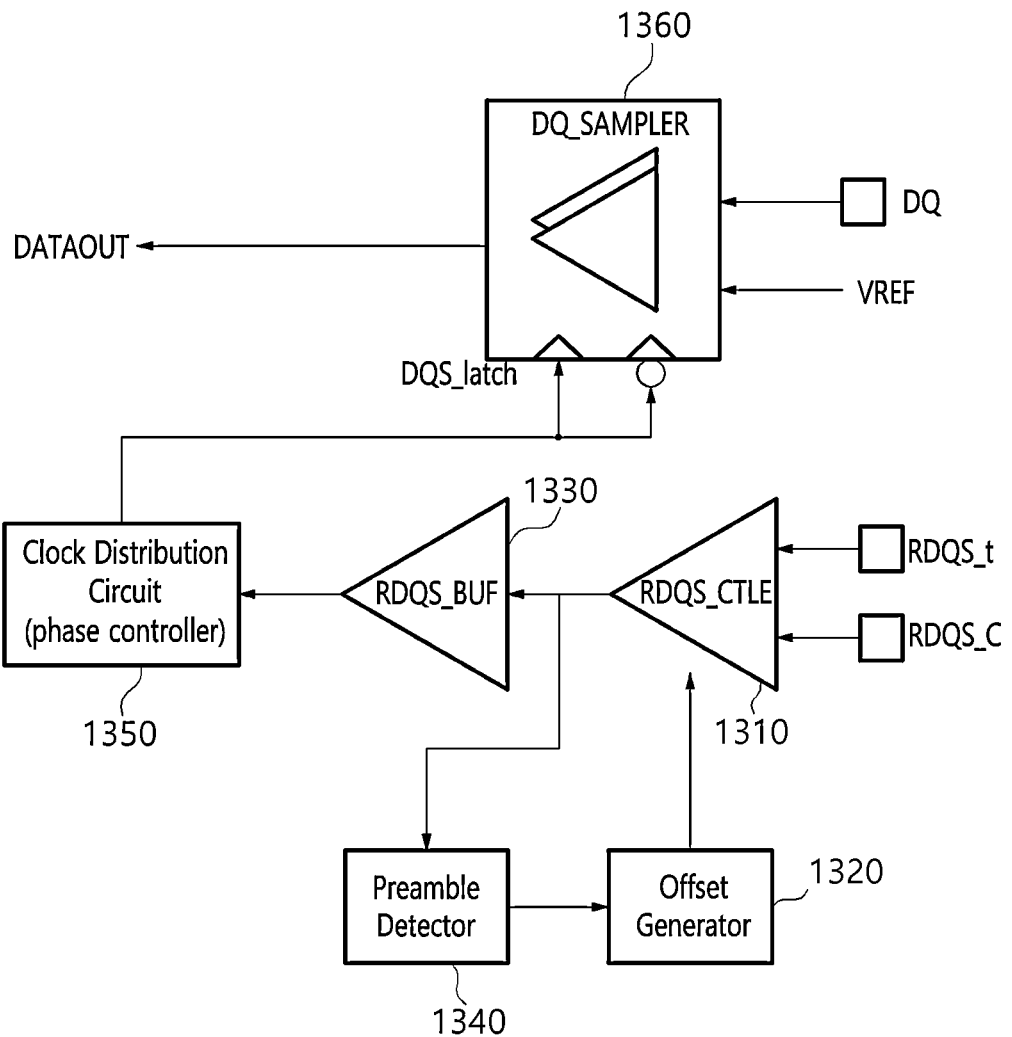
FIG. 11 is a block diagram illustrating an apparatus for receiving a strobe signal according to a second embodiment of the present disclosure.

FIG. 11 is a block diagram illustrating an apparatus for receiving a strobe signal according to a second embodiment of the present disclosure.

As illustrated in FIG. 11, the apparatus for receiving a strobe signal according to a second embodiment may include an amplifier 1310, a buffer 1330, a clock distribution circuit 1350, a data sampler 1360, an offset generator 1320, and a preamble detector 1340.

The amplifier 1310 may amplify a strobe signal. The strobe signal input to the amplifier may include a first strobe signal RDQS_t and a second strobe signal RDQS_c. The strobe signal RDQS_diff may be a difference signal between the first strobe signal and the second strobe signal.

In addition, the amplifier 1310 may equalize the first strobe signal RDQS_t and the second strobe signal RDQS_c. The amplifier 1310 may alternatively include a separate component for equalizing the first strobe signal and the second strobe signal.

The buffer 1330 may be provided with a strobe signal, convert the same into a digital signal, and output the digital signal. The buffer 1330 may drive a large load by receiving a strobe signal. The clock distribution circuit 1350 may receive the output of the buffer 1330, calibrate a phase difference between the received output and data DQ, and supply a strobe latch signal DQS_latch to the data sampler. The data sampler 1360 may capture data DQ according to the strobe latch signal and output the same.

Meanwhile, the apparatus for receiving a strobe signal may detect a preamble signal occurring at a point at which a strobe signal is equal to or greater than a preset threshold.

The apparatus for receiving a strobe signal may fail to detect an initial preamble signal in the process of detecting a preamble signal when the signal bandwidth of an interconnect channel is low.

In order to prevent this, the apparatus for receiving a strobe signal may include an offset generator 1320. The offset generator 1320 may control the setting of a preset threshold. The offset generator 1320 may lower a voltage and supply the same so as to decrease the set value of the initial threshold. The offset generator 1320 may control the setting of the threshold before a strobe signal is input to the amplifier.

The preamble detector 1340 may detect a preamble signal occurring at a point at which a strobe signal is equal to or greater than the threshold. The preamble detector 1340 may be connected to the output terminal of the amplifier 1310.

The preamble detector 1340 may turn off the offset generator 1320 when the first preamble signal is detected. When the offset generator 1320 is turned off, the threshold is set back to the initial set value.

Figure 12:
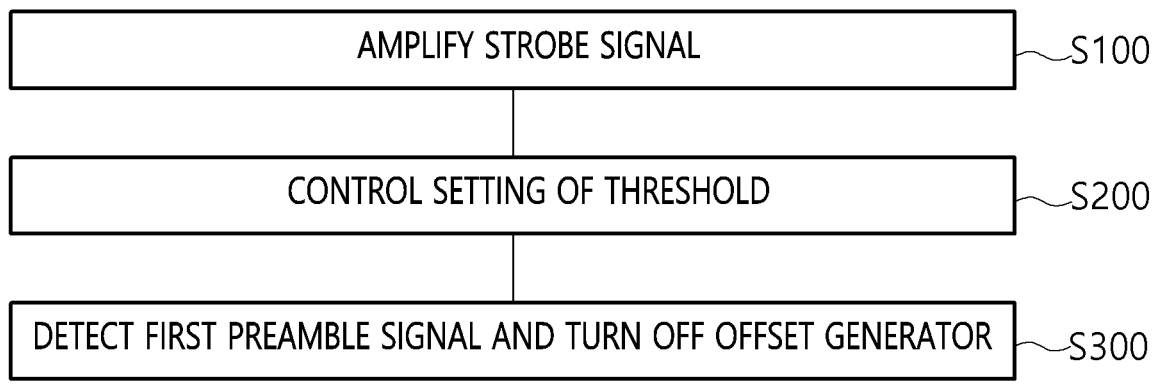
FIG. 12 is a flowchart illustrating a method for receiving a strobe signal according to an embodiment of the present disclosure.

FIG. 12 is a flowchart illustrating a method for receiving a strobe signal according to an embodiment of the present disclosure. The method for receiving a strobe signal may be performed by an apparatus for receiving a strobe signal.

The apparatus for receiving a strobe signal may amplify a strobe signal at step S100.

The apparatus for receiving a strobe signal may control the setting of a threshold at step S200. The apparatus for receiving a strobe signal may control the setting of the threshold so as to increase or decrease the preset threshold. The apparatus for receiving a strobe signal may control the setting of the threshold using an offset.

The apparatus for receiving a strobe signal may detect a first preamble signal and turn off an offset generator at step S300. The first preamble signal may be a signal detected at a point at which the initial strobe signal is equal to or greater than the threshold.

According to the present disclosure, an input voltage offset is adjusted while a strobe signal is stabilized, whereby the reliability of restoration of a strobe pulse and the stability of high-speed data transmission may be improved.

Also, the present disclosure may be implemented using a simple circuit, whereby the reliability of data transmission may be improved and the data transmission speed may be increased using a circuit that occupies a small area and consumes low power.

The spirit of the present disclosure should not be construed as being limited to the above-described embodiments, and the entire scope of the appended claims and their equivalents should be understood as defining the scope and spirit of the present disclosure.

What is claimed is:

1. An apparatus for receiving a strobe signal, comprising:
    an amplifier for amplifying a strobe signal input thereto;
    an offset generator for controlling a setting of a threshold for detecting a preamble signal by generating an offset for the amplifier; and
    a preamble detector for detecting a first preamble signal occurring at a point at which the amplified strobe signal is equal to or greater than the threshold and for turning off the offset generator when the first preamble signal is detected.

2. The apparatus of claim 1, wherein the offset generator generates the offset before the strobe signal is input to the amplifier.

3. The apparatus of claim 1, wherein the offset generator controls the setting of the threshold so as to decrease an initial set value of the threshold.

4. The apparatus of claim 1, wherein the offset generator includes multiple transistor switches, and an on/off operation of the offset generator is performed by on/off operations of the multiple transistor switches.

5. The apparatus of claim 4, wherein the offset generator includes current sources respectively connected to the multiple transistor switches, and the threshold is precisely controlled using the current sources.

6. The apparatus of claim 1, wherein the amplifier includes multiple differential-input transistors, and the offset generator is connected in parallel to the multiple differential-input transistors.

7. The apparatus of claim 1, wherein the preamble detector includes a counter for counting a pulse of the strobe signal and preamble detector logic for providing an on/off signal to the offset generator based on a result of counting.

8. The apparatus of claim 1, wherein the preamble detector includes a D flipflop, and detects a first falling edge of the strobe signal using the D flipflop, thereby providing an off signal to the offset generator.

9. The apparatus of claim 1, further comprising:
    a buffer capable of driving a load by receiving the amplified strobe signal.

10. The apparatus of claim 9, wherein the preamble detector is connected to an output terminal of the amplifier or an output terminal of the buffer.

11. A method for receiving a strobe signal, comprising:
    amplifying, by an amplifier, a strobe signal input to the amplifier;
    generating, by an offset generator, an offset for the amplifier, thereby controlling a setting of a threshold for detecting a preamble signal; and
    detecting, by a preamble detector, a first preamble signal occurring at a point at which the amplified strobe signal is equal to or greater than the threshold, and turning off the offset generator when the first preamble signal is detected.

12. The method of claim 11, wherein the offset is generated before the strobe signal is input to the amplifier.

13. The method of claim 11, wherein the offset generator controls the setting of the threshold so as to decrease an initial set value of the threshold.

14. The method of claim 11, wherein the offset generator includes multiple transistor switches, and an on/off operation of the offset generator is performed by on/off operations of the multiple transistor switches.

15. The method of claim 14, wherein the offset generator includes current sources respectively connected to the multiple transistor switches, and the threshold is precisely controlled using the current sources.

16. The method of claim 11, wherein the amplifier includes multiple differential-input transistors, and the offset generator is connected in parallel to the multiple differential-input transistors.

17. The method of claim 11, wherein the preamble detector includes a counter for counting a pulse of the strobe signal and preamble detector logic for providing an on/off signal to the offset generator based on a result of counting.

18. The method of claim 11, wherein the preamble detector includes a D flipflop, and detects a first falling edge of the strobe signal using the D flipflop, thereby providing an off signal to the offset generator.

19. The method of claim 11, further comprising:
receiving, by a buffer capable of driving a load, the amplified strobe signal.

20. The method of claim 19, wherein the preamble detector is connected to an output terminal of the amplifier or an output terminal of the buffer.

\* \* \* \* \*